(12) United States Patent
Huang (10) Patent No.: US 10,916,214 B2
(45) Date of Patent: Feb. 9, 2021

(54) ELECTRICAL LEVEL PROCESSING CIRCUIT, GATE DRIVING CIRCUIT AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventor: Yupeng Huang, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/600,654

(22) Filed: Oct. 14, 2019

(65) Prior Publication Data
US 2020/0312259 A1    Oct. 1, 2020

(30) Foreign Application Priority Data
Mar. 29, 2019    (CN) .......................... 2019 1 0249607

(51) Int. Cl.
G09G 3/36     (2006.01)
G11C 19/28    (2006.01)
H03K 3/037    (2006.01)

(52) U.S. Cl.
CPC ........... *G09G 3/3677* (2013.01); *G11C 19/28* (2013.01); *H03K 3/037* (2013.01); *G09G 2310/0286* (2013.01); *G09G 2320/0247* (2013.01); *G09G 2320/0257* (2013.01)

(58) Field of Classification Search
CPC combination set(s) only.
See application file for complete search history.

*Primary Examiner* — Robin J Mishler (57) ABSTRACT

An electrical level processing circuit, a gate driving circuit and a display device. The electrical level processing circuit includes: an electrical level conversion circuit, a control circuit, a switching circuit and a bootstrap circuit. The electrical level conversion circuit is configured to convert a received signal into a driving electrical level signal and provide it to a first node; the control circuit includes a detecting circuit, and the control circuit is configured to output a detecting control signal to a second node according to a signal detected by the detecting circuit; the switching circuit is configured to electrically conduct the first node and a third node in response to a first detecting control signal; and the bootstrap circuit is configured to amplify the driving electrical level signal and output it to an output terminal in response to the first detecting control signal.

19 Claims, 6 Drawing Sheets

ELECTRICAL LEVEL PROCESSING CIRCUIT, GATE DRIVING CIRCUIT AND DISPLAY DEVICE

The present application claims priority to Chinese patent application No. 201910249607.6, filed on Mar. 29, 2019, the entire disclosure of which is incorporated herein by reference as part of the present application.

TECHNICAL FIELD

At least one embodiment of the present disclosure relates to an electrical level processing circuit, a gate driving circuit and a display device.

BACKGROUND

When a display device is turned off, it is necessary to release the electric charge in a pixel to avoid problems such as afterimage and flicker due to a long-term existence of the electric charge. Generally, a thin film transistor included in a pixel circuit can be fully turned on to fully release the residual electric charge in the pixel, thereby avoiding an afterimage phenomenon in a case where the display device is turned off.

SUMMARY

At least one embodiment of the present disclosure provides an electrical level processing circuit, including: an electrical level conversion circuit, connected to a first node, and configured to convert a received signal into a driving electrical level signal and provide the driving electrical level signal to the first node; a control circuit, including a detecting circuit, the control circuit being connected to a second node, and configured to output a detecting control signal to the second node according to a signal detected by the detecting circuit, the detecting control signal including a first detecting control signal and a second detecting control signal; a switching circuit, connected to the first node, the second node, a third node and an output terminal, and configured to electrically conduct the first node and the third node in response to the first detecting control signal; and a bootstrap circuit, connected to the second node, the third node and the output terminal, and configured to amplify the driving electrical level signal and output the driving electrical level signal that has been amplified to the output terminal in response to the first detecting control signal.

For example, the switching circuit is further configured to electrically conduct the first node and the output terminal in response to the second detecting control signal.

For example, the detecting circuit includes: a temperature detecting sub-circuit and an operating voltage detecting sub-circuit. The temperature detecting sub-circuit is configured to detect an ambient temperature and output a temperature detecting signal according to the ambient temperature, the operating voltage detecting sub-circuit is configured to output a voltage detecting signal according to an operating voltage input to the electrical level processing circuit.

For example, the control circuit further includes an operation circuit, a first terminal of the operation circuit is configured to receive the voltage detecting signal, a second terminal of the operation circuit is configured to receive the temperature detecting signal, and a third terminal of the operation circuit is connected to the second node to output the detecting control signal to the second node. The operation circuit is configured to output the first detecting control signal in a case where the operating voltage is lower than a preset voltage and the ambient temperature is lower than a preset temperature. The operation circuit is configured to output the second detecting control signal in a case where the operating voltage is higher than the preset voltage and/or the ambient temperature is higher than the preset temperature.

For example, the operation circuit includes an AND gate.

For example, the bootstrap circuit includes a bootstrap capacitor and a unidirectional circuit. An input terminal of the unidirectional circuit is connected to a first power source, and an output terminal of the unidirectional circuit is connected to a first terminal of the bootstrap capacitor to provide a first voltage to the first terminal of the bootstrap capacitor, and a second terminal of the bootstrap capacitor is configured to be electrically conductive with the third node in response to the first detecting control signal.

For example, the unidirectional circuit includes a diode.

For example, the bootstrap circuit further includes a first switch and a second switch. A first terminal of the first switch and a first terminal of the second switch are connected to the second terminal of the bootstrap capacitor, a second terminal of the first switch is connected to a second power source, a second terminal of the second switch is connected to the third node. The first switch is configured to be in an on-state in response to the second detecting control signal to provide a second voltage to the second terminal of the bootstrap capacitor, and to be in an off-state in response to the first detecting control signal. The second switch is configured to be in an off-state in response to the second detecting control signal, and to be in an on-state in response to the first detecting control signal to provide a voltage of the driving electrical level signal to the second terminal of the bootstrap capacitor, so as to raise the first terminal of the bootstrap capacitor from the first voltage to a third voltage, the third voltage is a sum of the voltage of the driving electrical level signal and a voltage difference between the first voltage and the second voltage.

For example, the bootstrap circuit further includes a buffer. A first terminal of the buffer is connected to the third node, a second terminal of the buffer is connected to the first terminal of the bootstrap capacitor, a third terminal of the buffer is connected to the output terminal, and the buffer is configured to output the third voltage of the first terminal of the bootstrap capacitor to the output terminal in a case where the first node is conductive with the third node.

For example, the buffer includes a comparator or an operational amplifier.

For example, the second voltage is 0 V, the third voltage is a sum of the first voltage and the voltage of the driving electrical level signal.

For example, the first voltage is equal to the voltage of the driving electrical level signal.

For example, the switching circuit includes a third switch and a fourth switch. A first terminal of the third switch and a first terminal of the fourth switch are connected to the first node, and a second terminal of the third switch is connected to the third node, a second terminal of the fourth switch is connected to the output terminal. The third switch is configured to be in an on-state in response to the first detecting control signal, and to be in an off-state in response to the second detecting control signal. The fourth switch is configured to be in an on-state in response to the second detecting control signal, and to be in an off-state in response to the first detecting control signal.

For example, the first switch, the second switch, the third switch, and the fourth switch are all switching transistors, and control terminals of the four switches are all connected to the second node.

For example, the voltage of the driving electrical level signal is greater than a voltage of the received signal.

For example, the bootstrap circuit includes a bootstrap capacitor, a unidirectional circuit, a first switch, a second switch and a buffer. An input terminal of the unidirectional circuit is connected to a first power source, and an output terminal of the unidirectional circuit is connected to a first terminal of the bootstrap capacitor to provide a first voltage to the first terminal of the bootstrap capacitor, and a second terminal of the bootstrap capacitor is configured to be electrically conductive with the third node in response to the first detecting control signal. A first terminal of the first switch and a first terminal of the second switch are connected to the second terminal of the bootstrap capacitor, a second terminal of the first switch is connected to a second power source, and a second terminal of the second switch is connected to the third node. The first switch is configured to be in an on-state in response to the second detecting control signal to provide a second voltage to the second terminal of the bootstrap capacitor, and to be in an off-state in response to the first detecting control signal. The second switch is configured to be in an off-state in response to the second detecting control signal, and to be in an on-state in response to the first detecting control signal to provide a voltage of the driving electrical level signal to the second terminal of the bootstrap capacitor, so as to raise the first terminal of the bootstrap capacitor from the first voltage to a third voltage, the third voltage is a sum of the voltage of the driving electrical level signal and a voltage difference between the first voltage and the second voltage. A first terminal of the buffer is connected to the third node, a second terminal of the buffer is connected to the first terminal of the bootstrap capacitor, a third terminal of the buffer is connected to the output terminal, and the buffer is configured to output the third voltage of the first terminal of the bootstrap capacitor to the output terminal in a case where the first node is conductive with the third node.

For example, the switching circuit includes a third switch and a fourth switch. A first terminal of the third switch and a first terminal of the fourth switch are connected to the first node, a second terminal of the third switch is connected to the third node, and a second terminal of the fourth switch is connected to the output terminal. The third switch is configured to be in an on-state in response to the first detecting control signal, and to be in an off-state in response to the second detecting control signal. The fourth switch is configured to be in an on-state in response to the second detecting control signal, and to be in an off-state in response to the first detecting control signal.

At least one embodiment of the present disclosure provides a gate driving circuit, including a shift register circuit and an electrical level processing circuit. The shift register circuit is electrically connected to the electrical level processing circuit to receive a clock signal processed by the electrical level processing circuit. The electrical level processing circuit includes: an electrical level conversion circuit, connected to a first node, and configured to convert a received signal into a driving electrical level signal and provide the driving electrical level signal to the first node; a control circuit, including a detecting circuit, the control circuit being connected to a second node, and configured to output a detecting control signal to the second node according to a signal detected by the detecting circuit, the detecting control signal including a first detecting control signal and a second detecting control signal; a switching circuit, connected to the first node, the second node, a third node and an output terminal, and configured to electrically conduct the first node and the third node in response to the first detecting control signal; and a bootstrap circuit, connected to the second node, the third node and the output terminal, and configured to amplify the driving electrical level signal and output the driving electrical level signal that has been amplified to the output terminal in response to the first detecting control signal.

At least one embodiment of the present disclosure provides a display device, including a gate driving circuit, the gate driving circuit including a shift register circuit and an electrical level processing circuit. The shift register circuit is electrically connected to the electrical level processing circuit to receive a clock signal processed by the electrical level processing circuit. The electrical level processing circuit includes: an electrical level conversion circuit, connected to a first node, and configured to convert a received signal into a driving electrical level signal and provide the driving electrical level signal to the first node; a control circuit, including a detecting circuit, the control circuit being connected to a second node, and configured to output a detecting control signal to the second node according to a signal detected by the detecting circuit, the detecting control signal including a first detecting control signal and a second detecting control signal; a switching circuit, connected to the first node, the second node, a third node and an output terminal, and configured to electrically conduct the first node and the third node in response to the first detecting control signal; and a bootstrap circuit, connected to the second node, the third node and the output terminal, and configured to amplify the driving electrical level signal and output the driving electrical level signal that has been amplified to the output terminal in response to the first detecting control signal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1A:
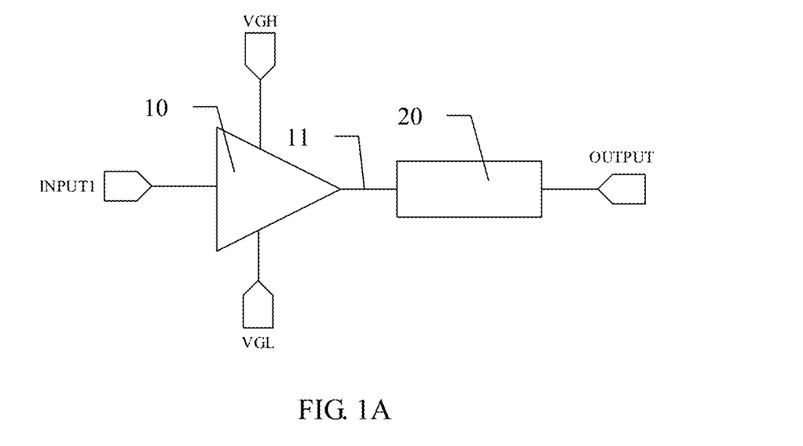
FIG. 1A is a schematic diagram of an electrical level conversion circuit.

FIG. 1A is a schematic diagram of an electrical level conversion circuit. As shown in FIG. 1A, the electrical level conversion circuit includes a buffer 10 (such as an operational amplifier or a comparator) and an XAO (Output All-on) circuit 20 connected to an output terminal 11 of the buffer 10. For example, a timing controller (TCON) provides a first signal (e.g., a clock signal CLK) of a logic reference level (e.g., 3.3V or 0V) to an signal input terminal INPUT1 of the buffer 10, a first level signal VGH is input to a first level input terminal VGH of the buffer 10, and a second level signal VGL is input to a second level input terminal VGL of the buffer 10. Depending on whether the input logic reference level is a high level or a low level, the output terminal 11 of the buffer 10 outputs a second signal equal to the first level signal VGH or the second level signal VGL as a converted output level of the first signal. That is, when the input logic reference level is a high level, the output terminal 11 of the buffer 10 outputs the second signal equal to the first level signal VGH; when the input logic reference level is a low level, the output terminal 11 of the buffer 10 outputs the second signal equal to the second level signal VGL. The second signal described above is input to the XAO circuit 20, and the XAO circuit 20 has an output terminal OUTPUT to output a third signal Vout. The third signal Vout can be used as a clock signal for driving a gate driving circuit. The above VGH can represent a first level input terminal, and can also represent a first level signal; the VGL can represent a second level input terminal, and can also represent a second level signal.

Figure 1B:
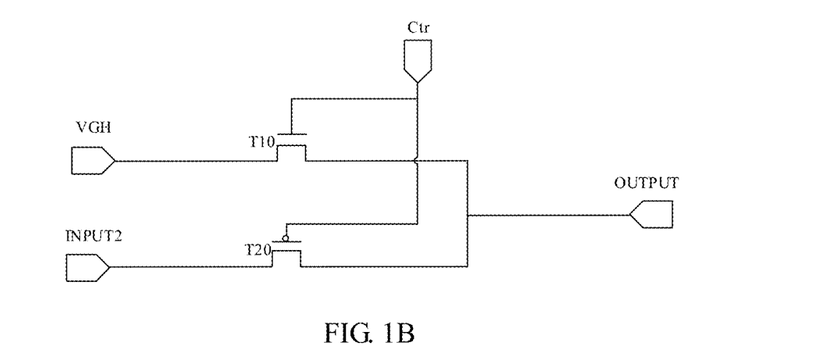
FIG. 1B is a schematic diagram of an example of the XAO circuit in FIG. 1A.

FIG. 1B is a schematic diagram of an example of the XAO circuit in FIG. 1A. As shown in FIG. 1B, the XAO circuit includes a control terminal Ctr, and the control terminal Ctr receives a turn-off detection signal VDIS from an operating voltage detecting circuit and controls two switching elements T10 and T20 according to the turn-off detection signal VDIS. Switching characteristics of the two switching elements are opposite, the switching element T10 receives the first level signal VGH, and an input terminal INPUT2 of the switching element T20 is connected to the output terminal 11 of the buffer 10.

For example, an array substrate of a display device includes a display region and a peripheral region. The display region includes a pixel region corresponding to sub-pixels and components such as gate lines, data lines, etc. The pixel region includes a pixel circuit, and the pixel circuit includes, for example, a thin film transistor serving as a switching element and a pixel electrode. The peripheral region includes a GOA type gate driving circuit, and the GOA type gate driving circuit includes a plurality of cascaded shift register units. Each shift register unit generally includes a plurality of thin film transistors and a capacitor, and an output terminal of each shift register unit outputs a scan signal. For example, each shift register unit is connected to one gate line in the display region, so as to provide a gate scan signal to the gate line at a predetermined time.

For example, input signals of the GOA type gate driving circuit include a clock signal, an turn-on signal STV (i.e., a shift trigger signal SR_IN), a high level signal VGH, and a low level signal VGL, etc. The clock signal CLK may include a first clock signal CLK1 and a second clock signal CLK2 as needed, and the GOA type gate drive circuit generates a scan signal using the received clock signal. Depending on a structure of the circuit of the shift register unit, the number of the clock signals input to the shift register unit is not limited to two, and can be one or more. The high level signal VGH and the low level signal VGL are used to provide a constant voltage signal for the GOA type gate driving circuit and the sub-pixels of the array substrate. Depending on different structures of different circuits of the shift register unit, one high level signal VGH and one low level signal VGL may be required, or a plurality of high level signals VGH and a plurality of low level signals VGL may be required, and embodiments of the present disclosure are not limited thereto.

Figure 1C:
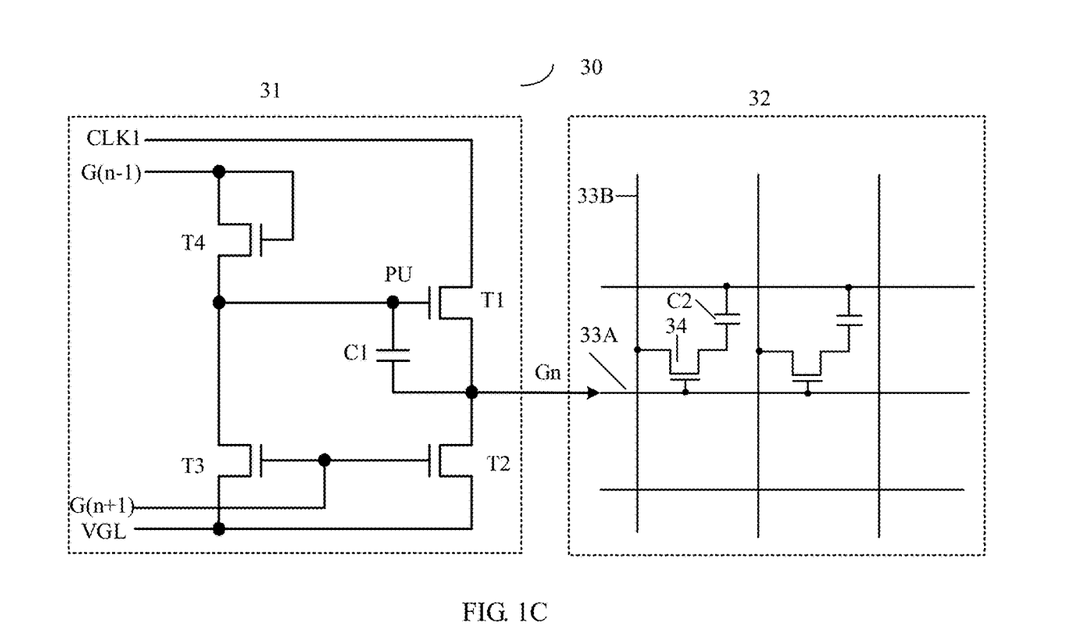
FIG. 1C is a schematic diagram of an array substrate of a display device including a gate driving circuit.

For example, FIG. 1C is a schematic diagram of an array substrate of a display device including a gate driving circuit, and the display device is a liquid crystal display device. As shown in FIG. 1C, the circuit 30 includes a GOA type gate driving circuit 31 and a sub-pixel circuit 32. In the array substrate, a plurality of gate lines 33A and a plurality of data lines 33B are arranged in an array and intersected to define a plurality of sub-pixels, and each of the sub-pixels generally includes at least one thin film transistor 34 and a liquid crystal capacitor C2. The thin film transistor 34 serves as a switching element and is connected to the gate line 33A, the data line 33B, and the pixel electrode (not shown in FIG. 1C), and the pixel electrode and a common electrode (not shown in FIG. 1C) serve as two electrodes of the liquid crystal capacitor C2, respectively. The thin film transistor 34 is controlled by the gate scan signal on the gate line 33A to apply a data signal on the data line 33B to the liquid crystal capacitor C2 for charging, thereby controlling deflection of liquid crystal molecules.

As shown in FIG. 1C, the shift register unit of the GOA type gate driving circuit 31 corresponding to the nth row (n is greater than or equal to 2) of sub-pixels includes a first transistor T1, a second transistor T2, a third transistor T3, a fourth Transistor T4 and a storage capacitor C1.

The first transistor T1 in the shift register unit is an output transistor of a signal output terminal of the shift register unit. For example, a first electrode of the first transistor T1 is connected to the first clock signal CLK1, and a second electrode of the first transistor T1 is connected to a first electrode of the second transistor T2 to obtain the output terminal of the shift register unit, and the output terminal of the shift register unit can output a gate scan signal Gn (the signal is a square wave pulse signal, correspondingly, the pulse portion is a turn-on level while the non-pulse portion is a turn-off level) applied for the nth row of sub-pixels, and an input signal applied for a next stage of shift register unit. A gate electrode of the first transistor T1 is connected to a pull-up node PU, thereby being connected to a first electrode of the third transistor T3 and a second electrode of the fourth transistor T4.

A second electrode of the second transistor T2 is connected to a second electrode of the third transistor T3 and the low level signal VGL. A gate electrode of the second transistor T2 is connected to a gate electrode of the third transistor T3 and an output terminal of a next row, that is, the (n+1)th row, of shift register unit, so as to receive a gate scan signal G(n+1) as an output pull-down control signal. The first electrode of the second transistor T2 is connected to the second electrode of the first transistor T1, and thus can be turned on under the control of the pull-down control signal, so as to pull the output signal of the output terminal to the low level signal VGL in a case where the gate scan signal Gn is not required to be output.

The first electrode of the third transistor T3 is also connected to the pull-up node PU, thereby being electrically connected to the second electrode of the fourth transistor T4 and the gate electrode of the first transistor T1. The second electrode of the third transistor T3 is connected to the low level signal VGL. The gate electrode of the third transistor T3 is also connected to the output terminal of the next row, that is, the (n+1)th row, of shift register unit, so as to receive the gate scan signal G(n+1) as an reset control signal (which is also an output pull-down control at the same time), and thus, the third transistor T3 can be turned on under the control of the reset control signal, so as to reset the pull-up node PU to the low level signal VGL, thereby turning off the first transistor T1.

A first electrode of the fourth transistor T4 is connected to a gate electrode thereof, and is connected to an output terminal of a previous row, that is, the (n−1)th row, of shift register unit, so as to receive a gate scan signal G(n−1) as an input signal (and an input control signal), the second electrode of the fourth transistor T4 is connected to the pull-up node PU, and thus, the pull-up node PU can be charged when the fourth transistor T4 is turned on, so that the voltage of the pull-up node PU can turn on the first transistor T1, and the first clock signal CLK1 is output through the output terminal. One terminal of the storage capacitor C1 is connected to the gate electrode of the first transistor T1, that is, connected to the pull-up node PU, and the other terminal of the storage capacitor C1 is connected to the second electrode of the first transistor T1, so that the storage capacitor C1 can store the electrical level of the pull-up node PU, and can continue to pull up the electrical level of the pull-up node PU by bootstrap effect thereof when the first transistor T1 is turned on, thereby improving output performance.

In the operation process of the gate driving circuit, when the gate scanning signal G(n−1) is a high level, the fourth transistor T4 is turned on and charges the pull-up node PU, and the raised level of the pull-up node turns on the first transistor T1, so the first clock signal CLK1 can be output at the output terminal through the first transistor T1, that is, the gate scan signal Gn is equal to the first clock signal CLK1. When the first clock signal CLK1 is a high level, the gate scan signal Gn also outputs a high level. When the gate scan signal Gn is a high level, the shift register unit of the GOA type gate driving circuit 31 inputs the high level signal Gn to a corresponding gate line 33A of the array substrate, so that gate electrodes of the thin film transistors 34 in all of the sub-pixels corresponding to the gate line 33A are applied with the signal, and thus, these thin film transistors 34 are all turned on. The data signal is input to the liquid crystal capacitor C2 of a corresponding sub-pixel through the thin film transistor 34 in each sub-pixel, so as to charge the liquid crystal capacitor C2 in the corresponding sub-pixel, thereby writing and holding of the signal voltage of the sub-pixel. When the gate scan signal G(n+1) is a high level, the second transistor T2 and the third transistor T3 are turned on, and the effect of resetting the pull-up node PU and pulling down the output terminal is achieved. Therefore, the GOA type gate driving circuit 31 can realize a progressive scan driving function of the array substrate.

Because the source electrode and the drain electrode of each of the above transistors are symmetrical, the source electrode and the drain electrode thereof can be interchanged. The first electrode can be, for example, a source electrode or a drain electrode, and the second electrode can be, for example, a drain electrode or a source electrode. In the present disclosure, the source electrode and the drain electrode of the thin film transistor are collectively referred to as "source drain electrodes", and are distinguished by a first source drain electrode and a second source drain electrode. For example, the above transistors may be N-type transistors. Of course, the above transistors are not limited to N-type transistors, and at least a part of them can be P-type transistors, whereby the polarity of the corresponding turn-on signal STV and the output scan signal can be changed accordingly.

It should be noted that, in various embodiments of the present disclosure, the structure of the shift register unit of the GOA type gate driving circuit 31 is not limited to the above-described structure, and the shift register unit of the GOA type gate driving circuit 31 can have any suitable structure, and can also include more or fewer transistors and/or capacitors. For example, sub-circuits for implementing functions such as pull-up node control, pull-down node control, noise reduction, etc., which are not limited thereto in the embodiments of the present disclosure.

When a display device (herein, a liquid crystal display device is taken as an example) including the above-described electrical level conversion circuit and using the above-described gate driving circuit is in a normal display state, the second signal does not change after passing through the XAO circuit 20. When the liquid crystal display device is in a turn-off process, whether the second signal is equal to the first level signal VGH or the second level signal VGL, the third signal Vout output from the output terminal OUTPUT of the XAO circuit 20 is equal to the first level signal VGH. For example, when the second signal is equal to the first level signal VGH, the XAO circuit 20 does not change the level of the second signal; when the second signal is equal to the second level signal VGL, the XAO circuit 20 is configured to output the first level signal VGH. Then, the first level signal VGH is output as a clock signal to the shift register, so that the shift register in the gate driving circuit generates a scan signal according to the first level signal VGH to turn on the transistor serving as a switching element in the sub-pixel, so as to release the electric charge in the sub-pixel completely.

In a study, an inventor of the present application has found that: in a case where a low-temperature environment test (for example, the display device is turned on and off for once every 3 seconds at an ambient temperature of −5° C.) is performed on a display device, the tester needs to adjust the power on timing sequence to a minimum value specified in the test specification, that is, to adjust a power on effective time to the shortest time; and to adjust the power off timing sequence to that each voltage and signal is powered off at the same time. At this time, the gate driving circuit in the display device is prone to present a limit power sequence (LPS) horizontal stripes. That is, the performance of the transistors included in the sub-pixel is deteriorated in a low-temperature environment, and the electron mobility is correspondingly deteriorated, and resulting in different degrees of charge residual at different positions of the display screen, thereby causing a phenomenon of horizontal stripes on the display screen of the display device. However, at a normal ambient temperature (for example, at an ambient temperature of 25° C.), when the display device is tested to be turned on and off for once every 3 seconds, the display screen does not exhibit the phenomenon of horizontal stripes.

Figure 1D:
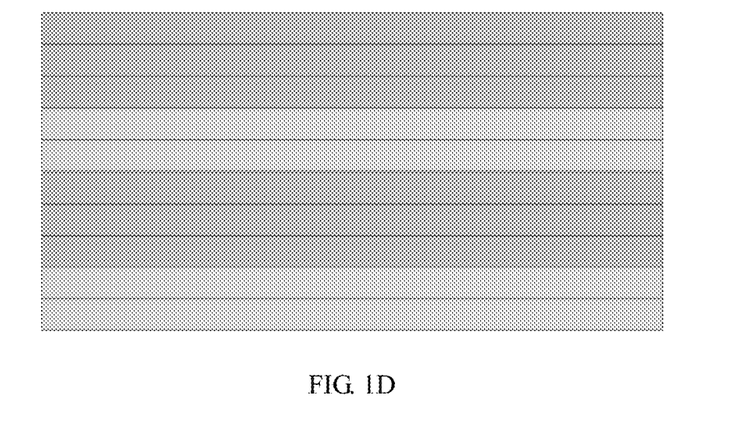
FIG. 1D is a schematic diagram of horizontal stripes appearing in a turn-off process of a display device in a low-temperature environment.

FIG. 1D is a schematic diagram of horizontal stripes appearing in a turn-off process of a display device in a low-temperature environment. When the display device including the electrical level conversion circuit shown in FIG. 1A is in a turn-off process, the first level signal VGH is gradually lowered. Therefore, in a low-temperature environment, the scan signal generated by the gate driving circuit according to the first level signal VGH may not completely turn on the transistor serving as a switching element in the sub-pixel, resulting in a different degree of electric charge residual in each pixel, so that the LPS horizontal stripes shown in FIG. 1D occurs.

At present, a solution to the phenomenon of horizontal stripes that occurs when the display device is in a low temperature environment includes: increasing the capacitance (playing a role of stabilizing the voltage and filtering) of the first level signal input terminal VGH (shown in FIG. 1A), so that the voltage of the second signal output from the output terminal 11 of the buffer 10 can be stabilized to a large extent in a case where the display device is turned off. However, the above method includes two disadvantages as follows: increasing cost and affecting the power on timing sequence (i.e., charging the capacitor of the first level signal input terminal in a case where the display device is turned off). Assuming that the capacitance of the first level signal input terminal is large, the display device may exhibit phenomena such as abnormal display (AD), etc., during power on. Therefore, how to ensure that the display device can effectively release the electric charge in the screen without affecting the power on timing sequence is particularly important when the surrounding environment of the display device is a low temperature and the display device is in a turn-off process.

Embodiments of the present disclosure provides an electrical level processing circuit, a gate driving circuit and a display device. The electrical level processing circuit includes: an electrical level conversion circuit, a control circuit, a switching circuit and a bootstrap circuit. The electrical level conversion circuit is connected to a first node, and is configured to convert a received signal into a driving electrical level signal and provide the driving electrical level signal to the first node. The control circuit includes a detecting circuit, and the control circuit is connected to a second node, and is configured to output a detecting control signal to the second node according to a signal detected by the detecting circuit. The detecting control signal includes a first detecting control signal and a second detecting control signal. The switching circuit is connected to the first node, the second node, a third node and an output terminal, and is configured to electrically conduct the first node and the third node in response to the first detecting control signal. The bootstrap circuit is connected to the second node, the third node and the output terminal, and is configured to amplify the driving electrical level signal and output the driving electrical level signal that has been amplified to the output terminal in response to the first detecting control signal. The electrical level processing circuit can be connected to, for example, a clock signal source (e.g., a timing controller) and a gate driving circuit, for processing a clock signal provided by the clock signal source and then supplying the processed clock signal to the gate driving circuit for outputting a scan signal, thereby further being applied for a display device.

The embodiments of the present disclosure do not limit the specific types and structures of applicable clock signal sources, gate drive circuits, and display devices.

In the present disclosure, in a case where the display device including the electrical level processing circuit is in the turn-off process, different detecting control signals are generated according to different ambient temperatures, and the bootstrap circuit and the switching circuit amplify the driving electrical level signal and output the driving electrical level signal that has been amplified to the output terminal in response to the first detecting control signal generated in a low-temperature environment. The amplified driving level signal serves as a gate scan signal input to the thin film transistor included in the sub-pixel, and a gate voltage of the thin film transistor is increased, so that the on-resistance of the thin film transistor is lowered to cause the residual electric charge in the sub-pixel to be released faster, thereby preventing the occurrence of LPS horizontal stripes.

An electrical level processing circuit, a gate driving circuit and a display device provided by the embodiments of the present disclosure are described with reference to the accompanying drawings.

Figure 2A:
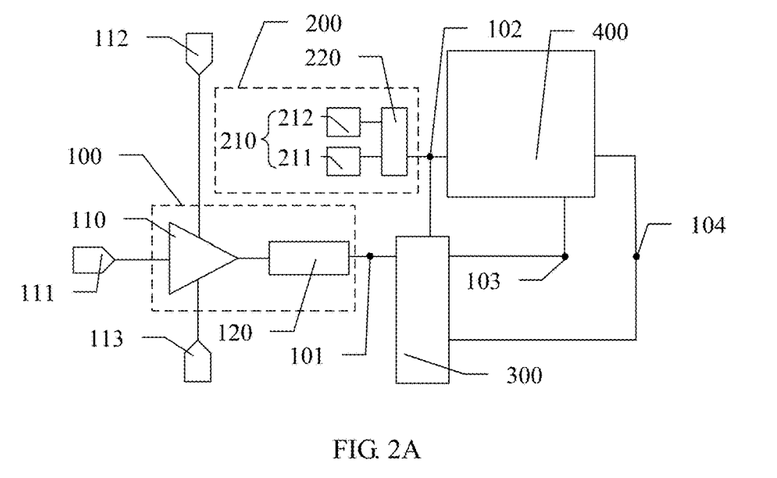
FIG. 2A is a schematic structural diagram of an electrical level processing circuit provided by an embodiment of the present disclosure.

At least one embodiment of the present disclosure provides an electrical level processing circuit, and FIG. 2A is a schematic structural diagram of an electrical level processing circuit provided by an embodiment. As shown in FIG. 2A, the electrical level processing circuit includes: an electrical level conversion circuit 100. The electrical level conversion circuit 100 is connected to a first node 101, and the electrical level conversion circuit 100 is configured to convert a received signal into a driving electrical level signal and provide the driving electrical level signal to the first node 101. For example, the received signal can be a clock signal, a frame starting signal, etc.

For example, the electrical level conversion circuit 100 in the present embodiment can be the electrical level conversion circuit shown in FIG. 1A, or can be any other type of electrical level conversion circuit, as long as it can realize the function of electrical level conversion between an input signal and an output signal. The electrical level conversion circuit 100 includes a first buffer 110 and an XAO circuit 120 connected to an output terminal of the first buffer 110, and the first buffer 110 can include a comparator or an operational amplifier. A first level input terminal 112 of the first buffer 110 inputs the first level signal VGH, and a second level input terminal 113 of the first buffer 110 inputs the second level signal VGL. According to whether the logic reference level of the received signal (e.g., a clock signal CLK) by an input terminal 111 of the first buffer 100 is a high level or a low level, the output terminal of the buffer 110 outputs a driving electrical level signal equal to the first level signal VGH or the second level signal VGL as a converted output level.

For example, when a display device including the electrical level conversion circuit 100 described above is in a display state, the driving electrical level signal is a signal that is alternately converted between the first level signal VGH and the second level signal VGL according to a predetermined timing sequence. The driving electrical level signal is output to the first node 101 after passing through the XAO circuit 120, and the signal output to the first node 101 is still a signal alternately converted between the first level signal VGH and the second level signal VGL according to a predetermined timing sequence, that is, the driving electrical level signal does not change after passing through the XAO circuit 120.

When the display device including the electrical level conversion circuit 100 described above is in a turn-off process, whether the driving electrical level signal is equal to the first level signal VGH or the second level signal VGL, the driving electrical level signal output from the XAO circuit 120 to the first node 101 is equal to the first level signal VGH. That is, after the XAO circuit 120 determines that the display device is in the turn-off process, it functions to make the driving electrical level signal output to the first node 101 equal to the first level signal VGH, and in this case, the voltage of the driving electrical level signal is greater than the voltage of the signal input to the first buffer 110.

In order to ensure that the display device including the electrical level conversion circuit can effectively release the electric charge in the screen without affecting the power on timing sequence during a turn-off process in a low-temperature environment, the electrical level processing circuit in the present embodiment further includes a control circuit 200, a switching circuit 300, and a bootstrap circuit 400.

As shown in FIG. 2A, the control circuit 200 includes a detecting circuit 210. The control circuit 200 is connected to a second node 102, and is configured to output a detecting control signal to the second node 102 according to a signal detected by the detecting circuit 210.

For example, as shown in FIG. 2A, the detecting circuit 210 includes: a temperature detecting sub-circuit 211 and an operating voltage detecting sub-circuit 212. The temperature detecting sub-circuit 211 is configured to detect an ambient temperature and output a temperature detecting signal according to the ambient temperature, that is, the temperature detecting sub-circuit 211 outputs a temperature detecting signal in accordance with a relationship between the ambient temperature and a preset temperature. The preset temperature herein can be obtained based on experimental tests, for example −5° C. The operating voltage detecting sub-circuit 212 is configured to output a voltage detecting signal according to an operating voltage input to the electrical level processing circuit, that is, the operating voltage detecting sub-circuit 212 outputs a voltage detecting signal in accordance with a relationship between the operating voltage and a preset voltage. The operating voltage herein refers to an operating voltage at which the display device is operating. During the turn-off process of the display device, the operating voltage is gradually reduced, and the operating voltage does not change when the display device is normally displaying. Therefore, it can be determined whether the display device is in a turn-off process according to the change of the operating voltage, and the preset voltage can be determined according to a specific circuit, and is not limited in the present embodiment.

Figure 2B:
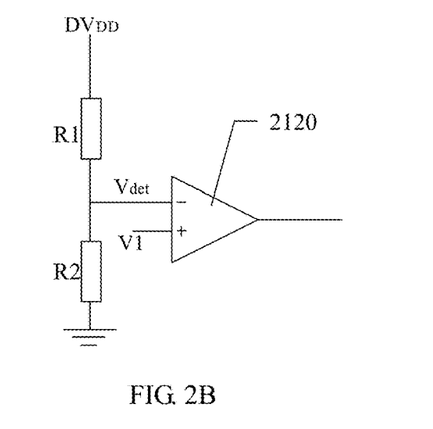
FIG. 2B is a schematic diagram of an example of the operating voltage detecting sub-circuit shown in FIG. 2A.

FIG. 2B is a schematic diagram of an example of the operating voltage detecting sub-circuit shown in FIG. 2A. As shown in FIG. 2B, in a case where the operating voltage DVDD drops, a monitored voltage $V_{det}$ in the resistor network of a first resistor R1 and a second resistor R2 changes, causing a voltage comparator 2120 to output a high level. For example, when the operating voltage is lower than the preset voltage V1, the operating voltage detecting circuit outputs a high level.

Figure 2C:
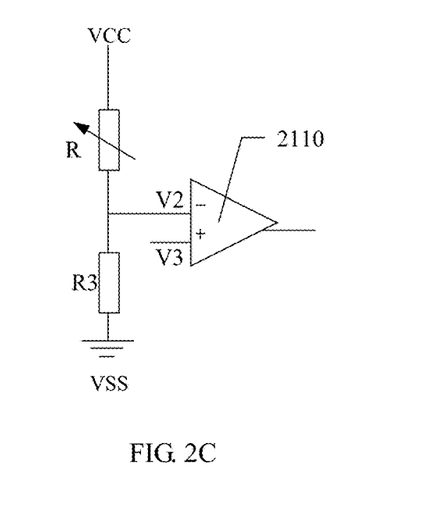
FIG. 2C is a schematic diagram of an example of the temperature detecting sub-circuit shown in FIG. 2A.

FIG. 2C is a schematic diagram of an example of the temperature detecting sub-circuit shown in FIG. 2A. As shown in FIG. 2C, the temperature detecting circuit 211 can include a third resistor R3, a thermistor R, and an operational amplifier 2110. A first terminal of the third resistor R3 receives a second power voltage VSS, a first terminal of the thermistor R is connected to a second terminal of the third resistor R3, a second terminal of the thermistor R receives a first power signal VCC, a first terminal of the operational amplifier 2110 is connected to the second terminal of the third resistor R3, and a second terminal of the operational amplifier 2110 receives a reference voltage V3. For example, the resistance of the thermistor R is inversely proportional to the ambient temperature. When the temperature is lowered, the resistance of the thermistor R is increased, and the voltage V2 input to the first terminal of the operational amplifier 2110 is decreased. When the voltage V2 is less than the reference voltage V3 of the first terminal of the operational amplifier 2110, a third terminal of the operational amplifier 2110 outputs a high level.

For example, as shown in FIG. 2A, the detecting control signal output by the control circuit 200 includes a first detecting control signal and a second detecting control signal. The control circuit is configured to output the first detecting control signal in a case where the operating voltage is lower than the preset voltage and the ambient temperature is lower than a preset temperature; the control circuit is further configured to output the second detecting control signal in a case where the operating voltage is higher than the preset voltage and/or the ambient temperature is higher than the preset temperature.

For example, in an example of the present embodiment, when the ambient temperature is lower than the preset temperature, the temperature detecting signal is a high level, and when the ambient temperature is higher than the preset temperature, the temperature detecting signal is a low level; when the operating voltage is lower than the preset voltage, the voltage detecting signal is a high level, and when the operating voltage is higher than the preset voltage, the voltage detecting signal is a low level. Therefore, in a case where the voltage detecting signal is a high level and the temperature detecting signal is a high level, the control circuit outputs the first detecting control signal; in a case where at least one of the voltage detecting signal and the temperature detecting signal is a low level, the control circuit outputs the second detecting control signal.

For example, as shown in FIG. 2A, the control circuit 200 further includes an operation circuit 220, such as an AND gate. A first terminal of the operation circuit 220 is connected to the operating voltage detecting sub-circuit 212 to receive the voltage detecting signal, a second terminal of the operation circuit 220 is connected to the temperature detecting sub-circuit 211 to receive the temperature detecting signal, and a third terminal of the operation circuit 220 is connected to the second node 102 to output the first detecting control signal or the second detecting control signal.

For example, according to the logical operation relationship of the AND gate, when the signals input to the first terminal and the second terminal of the AND gate are both high levels, the third terminal of the AND gate outputs a high level signal, and when at least one of the signals input to the first terminal and the second terminal thereof is a low level, the third terminal thereof outputs a low level. Therefore, the first detecting control signal is a high level signal, and the second detecting control signal is a low level signal. The present embodiment is described by taking a case that the first detecting control signal is a high level signal and the second detecting control signal is a low level signal as an example, but the present embodiment is not limited thereto. The operation circuit can also be in other forms, as long as the first detecting control signal and the second detecting control signal are different control signals.

As shown in FIG. 2A, the switching circuit 300 is connected to the first node 101, the second node 102, a third node 103 and an output terminal 104. And the switching circuit 300 is configured to electrically conduct the first node 101 and the third node 103 in response to the first detecting control signal, and to electrically conduct the first node 101 and the output terminal 104 in response to the second detecting control signal. That is, the switching circuit 300 in the present embodiment provides a first connecting channel that makes the first node 101 and the third node 103 in an on-state, and a second connecting channel that makes the first node 101 and the output terminal 104 in an on-state.

When the first node 101 and the third node 103 are in an on-state, an electrical level signal of the first node 101 can be transferred to the third node 103, and thus, the electrical level signal is input to the bootstrap circuit 400. As described below, the bootstrap circuit 400 can raise the electrical level signal of the third node 103 and output the raised electrical level signal. When the first node 101 and the output terminal 104 are in an on-state, an electrical level signal of the first node 101 can be transferred to the output terminal 104, and thus, the electrical level signal can be output as an output signal (Vout) from the output terminal 104.

For example, when the operating voltage is higher than the preset voltage, and/or the ambient temperature is higher than the preset temperature, the control circuit 200 outputs a second detecting signal, and the switching circuit 300 is configured to electrically conduct the first node 101 and the output terminal 104 in response to the second detecting control signal, and thus, the driving electrical level signal at the first node 101 is output to the output terminal 104 through the switching circuit 300. At this time, the electrical level processing circuit has the same effect as the electrical level conversion circuit shown in FIG. 1A.

For example, when the operating voltage is higher than the preset voltage, the display device is in a display state, and the driving electrical level signal is a signal that is alternately converted between the first level signal VGH and the second level signal VGL according to a predetermined timing sequence, and the signal alternately converted according to the predetermined timing sequence is output to the output terminal 104 through the switching circuit 300, and then is input to a gate driving circuit as a scan signal.

For example, when the operating voltage is lower than the preset voltage and the ambient temperature is higher than the preset temperature, that is, the environment around the display device is a normal temperature environment, and the display device is in a turn-off process, the electrical level conversion circuit makes the driving electrical level signal to be the first level signal VGH through the bootstrap circuit 400 as described below, and the voltage of the first level signal VGH is greater than the voltage of, for example, the clock signal input to the electrical level conversion circuit 100. Therefore, the electrical level conversion circuit functions to pull up the clock signal, so that the gate driving circuit outputs the driving electrical level signal as a scan signal, thereby turning on the thin film transistor in the sub-pixel to release the electric charge in the sub-pixel completely, and avoiding problems such as afterimage and flicker, etc., caused by a long-term existence of electric charge.

As shown in FIG. 2A, the bootstrap circuit 400 is connected to the second node 102, the third node 103, and the output terminal 104, and is configured to amplify the driving electrical level signal output by the electrical level conversion circuit 100 and output the driving electrical level signal that has been amplified to the output terminal 104 in response to the first detecting control signal.

For example, when the ambient temperature is lower than the preset temperature and the operating voltage is lower than the preset voltage, the control circuit 200 outputs the first detecting control signal. The switching circuit 300 makes the first node 101 electrically conduct with the third node 103 in response to the first detecting control signal, and thus, the driving electrical level signal at the first node 101 is output to the third node 103 through the switching circuit 300. The bootstrap circuit 400 amplifies the driving electrical level signal at the third node 103 and outputs the driving electrical level signal that has been amplified to the output terminal 104, that is, the driving electrical level signal is pulled up by the bootstrap circuit 400 and then is input to the output circuit included in the shift register circuit to be output as a scan signal.

For example, when the operating voltage is lower than the preset voltage and the ambient temperature is lower than the preset temperature, that is, the display device is in a low temperature environment, and is in a turn-off process, the driving electrical level signal is a first level signal. The first level signal is pulled up by the bootstrap circuit 400, and the gate drive circuit uses the pulled-up driving electrical level signal as a scan signal, thereby turning on the thin film transistor in the sub-pixel in a low temperature environment to release the electric charge in the sub-pixel completely, so as to avoid the phenomenon of LPS horizontal stripes.

Figure 2D:
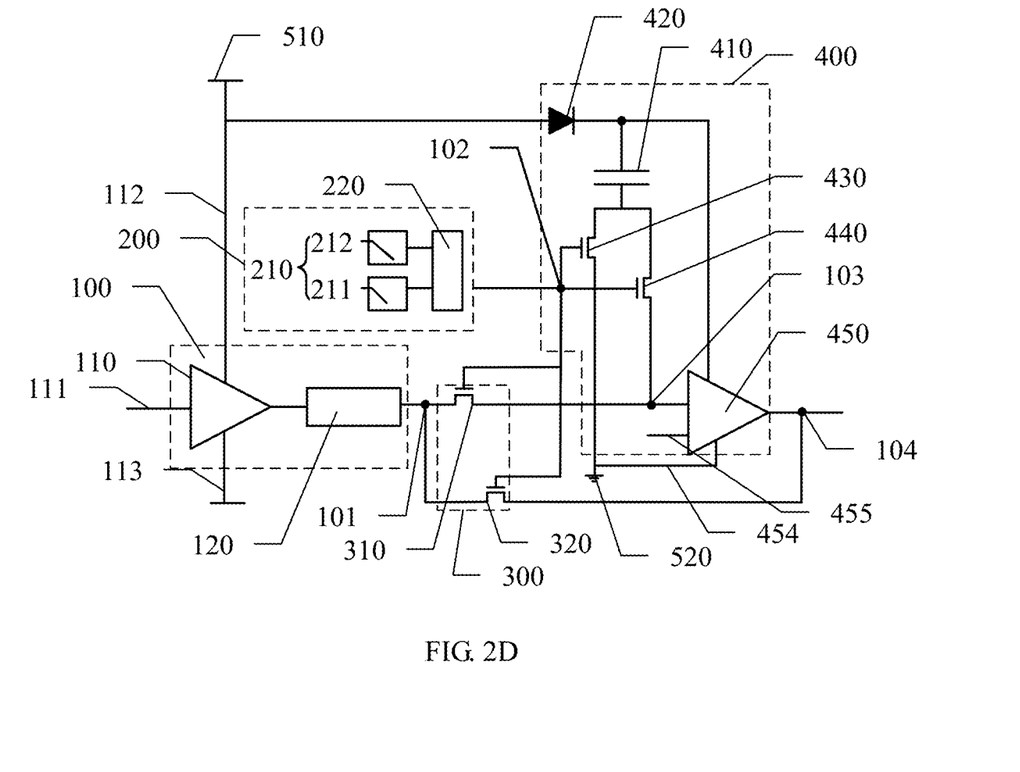
FIG. 2D is a schematic diagram of an electrical level processing circuit provided by an embodiment of the present disclosure.

FIG. 2D is a schematic diagram of an electrical level processing circuit provided by an example of an embodiment of the present disclosure. As shown in FIG. 2D, the bootstrap circuit 400 includes a bootstrap capacitor 410 and a unidirectional circuit (e.g., diode 420). The unidirectional circuit in the present disclosure includes but is not limited to the diode. An input terminal of the diode 420 is connected to a first power source 510 to receive a first voltage output by the first power source 510, and an output terminal of the diode 420 is connected to a first terminal of the bootstrap capacitor 410 to provide the first voltage to the first terminal of the bootstrap capacitor 410, and a second terminal of the bootstrap capacitor 410 is configured to be electrically conductive with the third node 103 in response to the first detecting control signal. For example, the first voltage can be the voltage of the first level signal VGH.

The bootstrap circuit here is a boosting circuit, which uses electronic components such as a bootstrap capacitor and a unidirectional circuit (e.g., a diode) to make a floating storage voltage of the bootstrap capacitor itself at the first terminal superimpose with the voltage of the driving electrical level at the third node 103, so as to boost the voltage at the first terminal of the bootstrap capacitor. The boosted voltage is input to a buffer 450 described below as a power voltage, and is output by the buffer 450. The above unidirectional circuit is to prevent current backflow, to make the first terminal of the bootstrap capacitor be floating, and due to the charge conservation principle, the voltage difference between the two terminals of the bootstrap capacitor remains unchanged, thereby generating a bootstrap effect.

For example, as shown in FIG. 2D, the bootstrap circuit 400 further includes a first switch 430 and a second switch 440. A first terminal of the first switch 430 and a first terminal of the second switch 440 are connected to the second terminal of the bootstrap capacitor 410, and a second terminal of the first switch 430 is connected to a second power source 520 (for example, the second terminal of the first switch 430 can be connected to the ground), and a second terminal of the second switch 440 is connected to the third node 103. Control terminals of the first switch 430 and the second switch 440 are both connected to the second node 102, and the detecting control signals for controlling the first switch 430 and the second switch 440 to be turned on are different, that is, a detecting control signal for controlling one of the first switch 430 and the second switch 440 to be turned on is the first detecting control signal, and a detecting control signal for controlling the other of the first switch 430 and the second switch 440 to be turned on is the second detecting control signal.

For example, the first switch 430 is configured to be in an on-state in response to the second detecting control signal to provide a second voltage to the second terminal of the bootstrap capacitor 410. That is, when the operation circuit 220, such as the AND gate, outputs a low level signal, the first switch 430 is in an on-state, the second terminal of the bootstrap capacitor 410 is connected to the second power source 520 through the first switch 430, the second power source 520 provides the second voltage to the second terminal of the bootstrap capacitor 410, and the bootstrap capacitor 410 is in a charging state.

For example, the first switch 430 is a switching transistor, a control terminal of the first switch 430 is connected to the second node 102, one of source electrode and drain electrode of the first switch 430 is connected to the second power source 520, and the other is connected to the second terminal of the bootstrap capacitor 410. When a low level signal is input to the control terminal of the first switch 430, the first switch 430 is turned on, that is, the first switch 430 is a P-type switching transistor.

For example, the first switch 430 is further configured to be in an off-state in response to the first detecting control signal, that is, when the AND gate 220 outputs a high level signal, the first switch 430 is in an off-state. At this time, the voltage difference between the two terminals of the bootstrap capacitor 410 is a voltage difference between the first voltage and the second voltage, that is, the storage voltage of the bootstrap capacitor 410 is the voltage difference between the first voltage and the second voltage.

For example, the second switch 440 is configured to be in an off-state in response to the second detecting control signal, that is, when the AND gate 220 outputs a low level signal, the second switch 440 is in an off-state. At this time, the bootstrap capacitor 410 is in a charging state.

For example, the second switch 440 is further configured to be in an on-state in response to the first detecting control signal to provide a voltage of the driving electrical level signal to the second terminal of the bootstrap capacitor 410, so as to raise the first terminal of the bootstrap capacitor 410 from the first voltage to a third voltage, and the third voltage is a sum of the voltage of the driving electrical level signal and the voltage difference between the first voltage and the second voltage. That is, when the AND gate 220 outputs a high level signal, the second switch 440 is in an on-state, at this time, the storage voltage of the bootstrap capacitor 410 (the voltage difference between the first voltage and the second voltage) and the voltage of the driving level signal is superimposed to raise the voltage at the first terminal of the bootstrap capacitor to the third voltage.

For example, the second switch 440 is a switching transistor, a control terminal of the second switch 440 is connected to the second node 102, one of source electrode and drain electrode of the second switch 440 is connected to the third node 103, and the other is connected to the second terminal of the bootstrap capacitor 410. When a high level signal is input to the control terminal, the second switch 440 is turned on, that is, the second switch 400 is an N-type switching transistor.

For example, the second voltage is 0 V, and the third voltage is a sum of the first voltage and the voltage of the driving electrical level signal.

For example, the first voltage is equal to the voltage of the driving electrical level signal, and the third voltage is twice the voltage of the driving electrical level signal, that is, the bootstrap capacitor 410 amplifies the driving electrical level signal twice.

For example, the discharging rate of the thin film transistor included in the sub-pixel of the display device is mainly determined by the gate-source voltage difference (VGS) and the channel width-to-length ratio of the thin film transistor. Although the channel width-to-length ratio can be increased to increase the discharging rate, the thin film transistor will occupy a larger area and reduce the transmittance of the display panel. Therefore, the discharging rate can be increased by increasing the voltage difference VGS. An example of the present embodiment amplifies the driving electrical level signal by two times, that is, the voltage difference VGS is amplified by two times, which can effectively increase the discharging rate of the thin film transistor, thereby achieving the purpose of quickly releasing the residual electric charge. However, the present embodiment is not limited thereto, and the amplification times of the driving electrical level signal can be determined according to specific situations, as long as the thin film transistor can withstand the voltage difference VGS after amplifying the driving electrical level signal.

For example, as shown in FIG. 2D, the bootstrap circuit 400 further includes a buffer 450 (a second buffer 450). A first terminal of the buffer 450 is connected to the third node 103, a second terminal of the buffer 450 is connected to the first terminal of the bootstrap capacitor 410, a third terminal of the buffer 450 is connected to the output terminal 104, and the buffer 450 is configured to output the third voltage of the first terminal of the bootstrap capacitor 410 to the output terminal 104 in a case where the first node 101 is conductive with the third node 103.

For example, the buffer 450 in the present example can include a comparator or an operational amplifier. The present example taking that the buffer includes a comparator as an example, the buffer 450 further includes a fourth terminal 454 and a fifth terminal 455, the fourth terminal 454 of the buffer 450 is connected to the second power source 520 to provide a low level signal, and the fifth terminal 455 of the buffer 450 is input with a fourth voltage Vref to be compared with the voltage of the driving electrical level signal. A positive phase input terminal of the comparator (the first terminal of the buffer) is connected to the third node, and a negative phase input terminal of the comparator (the fifth terminal of the buffer) is input with the fourth voltage Vref. When the voltage of the driving electrical level signal at the third node is greater than the fourth voltage Vref, the buffer outputs the third voltage of the first terminal of the bootstrap capacitor to the output terminal. The present embodiment is not limited thereto, as long as the buffer can output the third voltage to the output terminal when the third node has the driving electrical level signal.

For example, as shown in FIG. 2D, the switching circuit 300 includes a third switch 310 and a fourth switch 320. A first terminal of the third switch 310 and a first terminal of the fourth switch 320 are connected to the first node 101, a second terminal of the third switch 310 is connected to the third node 103, and a second terminal of the fourth switch 320 is connected to the output terminal 104. Control terminals of the third switch 310 and the fourth switch 320 are both connected to the second node 102, and detecting control signals for controlling the third switch 310 and the fourth switch 320 to be turned on are different, that is, a detecting control signal for controlling one of the third switch 310 and the fourth switch 320 to be turned on is the first detecting control signal, and a detecting control signal for controlling the other of the third switch 310 and the fourth switch 320 to be turned on is the second detecting control signal.

For example, the third switch 310 is configured to be in an on-state in response to the first detecting control signal, and at this time, the fourth switch 320 is configured to be in an off-state in response to the first detecting control signal, that is, when the AND gate 220 outputs a high level signal, the third switch 310 is in an on-state, and the fourth switch 320 is in an off-state, so as to electrically conduct the first node 101 and the third node 103, thereby delivering the driving electrical level signal to the third node 103.

For example, the third switch 310 is further configured to be in an off-state in response to the second detecting control signal, and at this time, the fourth switch 320 is configured to be in an on-state in response to the second detecting control signal, that is, when the AND gate 220 outputs a low level signal, the fourth switch 320 is in an on-state, the third switch 310 is in an off-state, and the first node 101 is electrically conductive with the output terminal 104, thereby transferring the driving electrical level signal to the output terminal 104.

For example, the third switch 310 is a switching transistor, a control terminal of the third switch 310 is connected to the second node 102, one of source electrode and drain electrode of the third switch 310 is connected to the first node 101, and the other is connected to the third node 103. When a high level signal is input to the control terminal, the third switch 310 is turned on, that is, the third switch 310 is an N-type switching transistor.

For example, the fourth switch 320 is a switching transistor, a control terminal of the fourth switch 320 is connected to the second node 102, one of source electrode and drain electrode of the fourth switch 320 is connected to the first node 101, and the other is connected to the output terminal 104. When a low level signal is input to the control terminal, the fourth switch 320 is turned on, that is, the fourth switch 320 is a P-type switching transistor.

When the electrical level processing circuit provided by the embodiments of the present disclosure is applied for a display device, the electrical level processing circuit can be connected to a clock signal source (such as a timing controller) and a gate driving circuit for processing a clock signal provided by the clock signal source and then supplying the processed clock signal to the gate driving circuit for outputting a scan signal. When the ambient temperature around the display device is higher than the preset temperature, whether the display device is in a display state or a turn-off process (i.e., except when the display device is turned off at a low temperature), the second detecting control signal output by the control circuit can control the first switch and the fourth switch to be turned on, so that the bootstrap capacitor included in the bootstrap circuit is charged, and the driving electrical level signal output by the electrical level conversion circuit is output to the output terminal through the fourth switch. When the ambient temperature around the display device is lower than the preset temperature (in a low-temperature environment) and the display device is in a turn-off process, the first detecting control signal output by the control circuit can control the second switch and the third switch to be turned on, so that the driving electrical level signal is input to the third node through the third switch, and the voltage supplied by the bootstrap capacitor to the buffer is the sum of the voltage of the driving electrical level signal and the storage voltage of the bootstrap capacitor, and thus, the buffer outputs the driving electrical level signal that has been amplified to the output terminal to cause the residual electric charge in the sub-pixel of the display device to be released faster, thereby preventing the occurrence of LPS horizontal stripes. The electrical level processing circuit provided by the embodiments of the present disclosure can ensure that the display device can effectively release the electric charge in the screen without affecting the power on timing sequence when the surrounding environment of the display device is a low temperature and the display device is in a turn-off process.

Figure 3A:
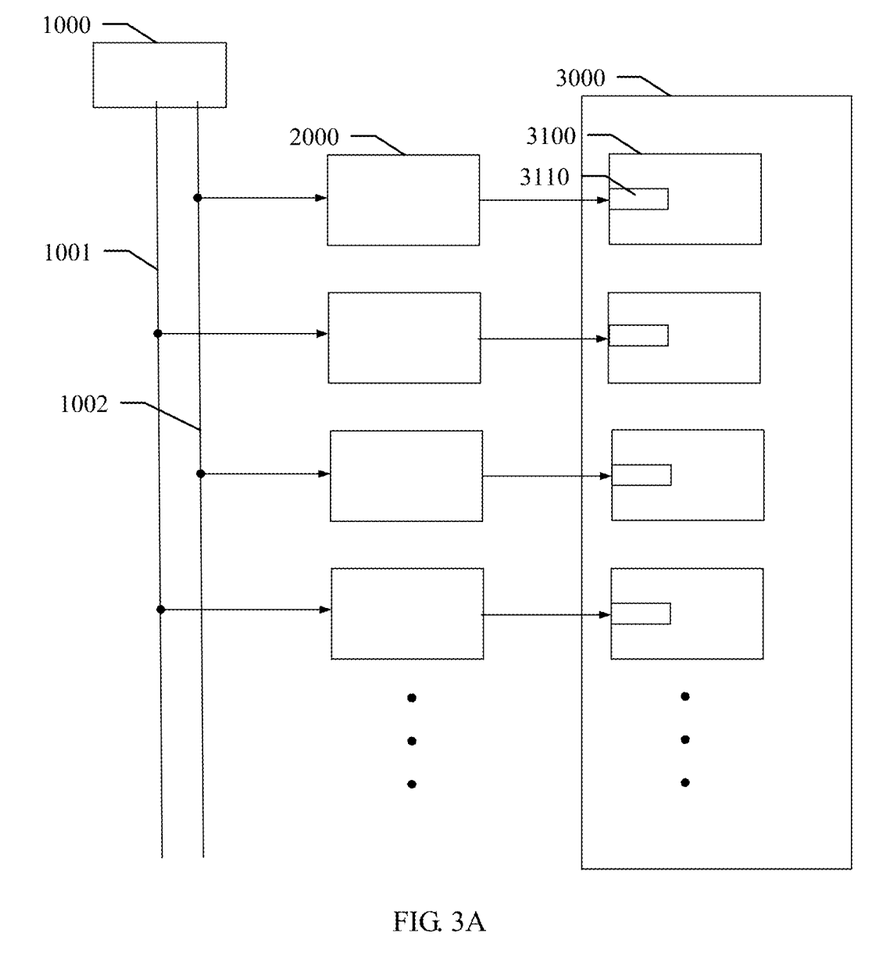
FIG. 3A is a schematic diagram of a gate driving circuit provided by an example of an embodiment of the present disclosure.

Another embodiment of the present disclosure provides a gate driving circuit, and FIG. 3A is a schematic diagram of a gate driving circuit provided by an example of the present embodiment.

As shown in FIG. 3A, the gate drive circuit includes a shift register circuit 3000 and the electrical level processing circuit 2000 described above. The shift register circuit 3000 includes a plurality of cascaded shift register units 3100, and each shift register unit 3100 includes an output circuit 3110. The electrical level processing circuit 2000 converts a received clock signal into an driving electrical level signal that has been amplified (that is, a clock signal converted by the electrical level conversion circuit and the bootstrap circuit), and outputs driving electrical level signal that has been amplified to the output circuit 3110. The output circuit 3110 is connected to, for example, one gate line in the display panel, and is configured to output the driving electrical level signal as a scan signal to the gate line connected thereto.

For example, as shown in FIG. 3A, the gate driving circuit includes a plurality of electrical level processing circuits 2000, and the plurality of electrical level processing circuits 2000 are in one-to-one correspondence with the plurality of cascaded shift register units 3100. For example, the electrical level processing circuit 2000 included in the gate driving circuit is electrically connected to the timing controller 1000, for example, is electrically connected to the timing controller 1000 through a first clock signal line 1001 and a second clock signal line 1002 connected to the timing controller 1000. For example, the timing controller 1000 can be configured to provide a first clock signal and a second clock signal to the plurality of electrical level processing circuits 2000 through the first clock signal line 1001 and the second clock signal line 1002, thereby providing the first clock signal and the second clock signal to each register unit 3100. The first clock signal and the second clock signal have the same period and are different from each other by half a period.

For example, the second clock signal line 1002 is connected to the (2n−1)th (n is an integer greater than 0) electrical level processing circuit 2000, and the first clock signal line 1001 is connected to the (2n)th electrical level processing circuit 2000. It should be noted that the gate driving circuit can be connected to four, or six, or eight or more clock signal lines according to the structure and timing sequence control of the shift register units in the shift register thereof, so as to receive four, or six, or eight or more clock signals. The number of clock signal lines depends on specific situations, and is not limitative in the embodiments of the present disclosure.

Figure 3B:
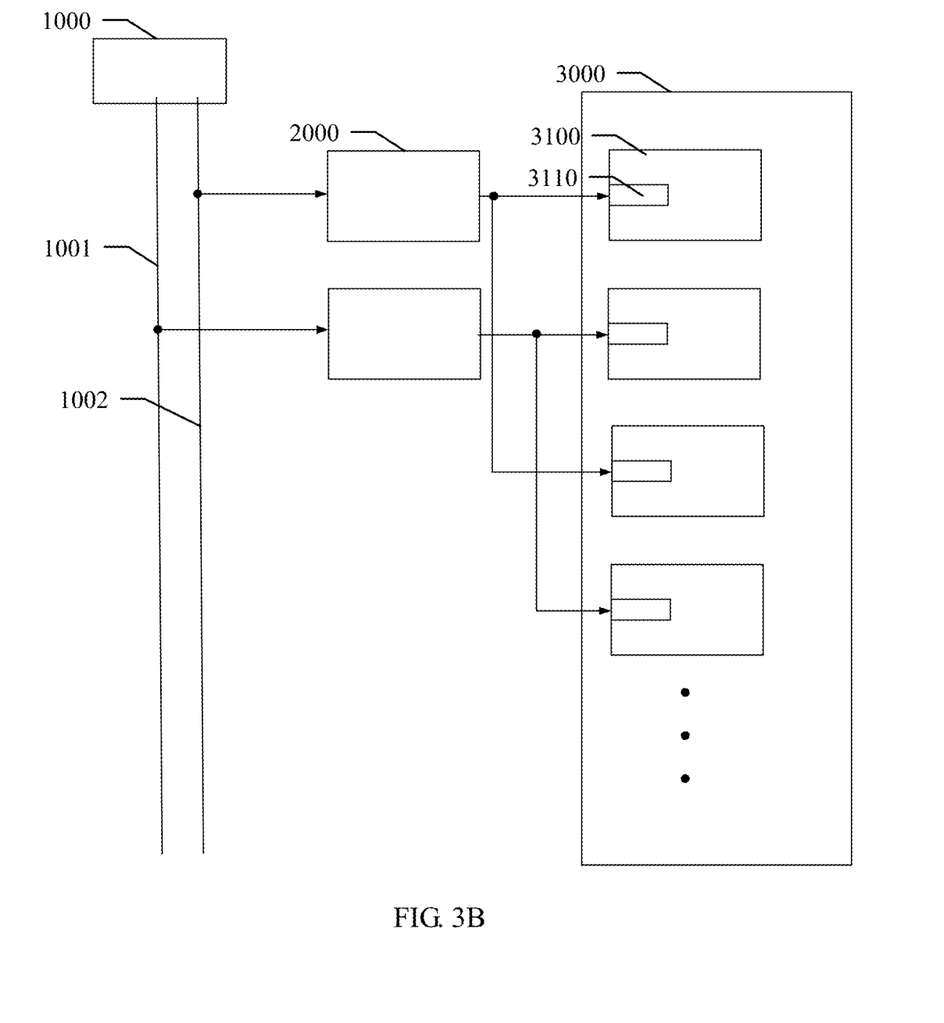
FIG. 3B is a schematic diagram of a gate driving circuit provided by another example of an embodiment of the present disclosure.

FIG. 3B is a schematic diagram of a gate driving circuit provided by another example of an embodiment of the present disclosure. As shown in FIG. 3B, the gate driving circuit is similar in structure to the gate driving circuit shown in FIG. 3A, except the manner that one electrical level processing circuit 2000 corresponds to a plurality of cascaded shift register units 3100. For example, the gate driving circuit includes two electrical level processing circuits 2000, the first electrical level processing circuit 2000 is connected to the (2n−1)th (n is an integer greater than 0) stage of shift register unit 3100, and the first electrical level processing circuit 2000 converts a received clock signal into a driving electrical level signal and outputs it to the output circuit 3110 of the (2n−1)th stage of shift register unit 3100; the second electrical level processing circuit 2000 is connected to the (2n)th (n is an integer greater than 0) stage of shift register unit 3100, and the second electrical level processing circuit 2000 converts a received clock signal into a driving electrical level signal and outputs it to the output circuit 3110 of the (2n)th stage of shift register unit 3100.

Technical effects of the gate driving circuit provided by the embodiments of the present disclosure can be referred to the related description of the electrical level processing circuit in the aforementioned embodiments, and are not described here again.

Another embodiment of the present disclosure provides a display device, and the display device includes the gate driving circuit described above.

For example, the display device can be any product or component having a display function, such as a liquid crystal panel, a liquid crystal television, a display, an organic light-emitting diode (OLED) display panel, an OLED television, an electronic paper display device, a mobile phone, a tablet computer, a notebook computer, a digital photo frame, a navigator, etc. The display device can further include other conventional components, such as a display panel, etc., which is not limited by the embodiments of the present disclosure.

Technical effects of the display device provided by the embodiments of the present disclosure can be referred to the related description of the gate driving circuit in the aforementioned embodiments, and are not described here again.

The following statements should be noted:

(1) The accompanying drawings of the embodiment(s) of the present disclosure involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, and the protection scope of the present disclosure is not limited thereto. Therefore, the protection scope of the present disclosure should be based on the protection scope of the claims.

What is claimed is:

1. An electrical level processing circuit, comprising:
an electrical level conversion circuit, connected to a first node, and configured to convert a received signal into a driving electrical level signal and provide the driving electrical level signal to the first node;
a control circuit, comprising a detecting circuit, the control circuit being connected to a second node, and configured to output a detecting control signal to the second node according to a signal detected by the detecting circuit, wherein the detecting control signal comprises a first detecting control signal and a second detecting control signal;
a switching circuit, connected to the first node, the second node, a third node and an output terminal, and configured to electrically conduct the first node and the third node in response to the first detecting control signal; and
a bootstrap circuit, connected to the second node, the third node and the output terminal, and configured to amplify the driving electrical level signal and output the driving electrical level signal that has been amplified to the output terminal in response to the first detecting control signal.

2. The electrical level processing circuit according to claim 1, wherein the switching circuit is further configured to electrically conduct the first node and the output terminal in response to the second detecting control signal.

3. The electrical level processing circuit according to claim 1, wherein the detecting circuit comprises:
a temperature detecting sub-circuit and an operating voltage detecting sub-circuit,
wherein the temperature detecting sub-circuit is configured to detect an ambient temperature and output a temperature detecting signal according to the ambient temperature, and the operating voltage detecting sub-circuit is configured to output a voltage detecting signal according to an operating voltage input to the electrical level processing circuit.

4. The electrical level processing circuit according to claim 3, wherein the control circuit further comprises an operation circuit,
a first terminal of the operation circuit is configured to receive the voltage detecting signal, a second terminal of the operation circuit is configured to receive the temperature detecting signal, and a third terminal of the operation circuit is connected to the second node to output the detecting control signal to the second node,
the operation circuit is configured to output the first detecting control signal in a case where the operating voltage is lower than a preset voltage and the ambient temperature is lower than a preset temperature;
the operation circuit is configured to output the second detecting control signal in a case where the operating voltage is higher than the preset voltage and/or the ambient temperature is higher than the preset temperature.

5. The electrical level processing circuit according to claim 4, wherein the operation circuit comprises an AND gate.

6. The electrical level processing circuit according to claim 1, wherein the bootstrap circuit comprises a bootstrap capacitor and a unidirectional circuit,
an input terminal of the unidirectional circuit is connected to a first power source, and an output terminal of the unidirectional circuit is connected to a first terminal of the bootstrap capacitor to provide a first voltage to the first terminal of the bootstrap capacitor, and a second terminal of the bootstrap capacitor is configured to be electrically conductive with the third node in response to the first detecting control signal.

7. The electrical level processing circuit according to claim 6, wherein the unidirectional circuit comprises a diode.

8. The electrical level processing circuit according to claim 6, wherein the bootstrap circuit further comprises a first switch and a second switch,
   a first terminal of the first switch and a first terminal of the second switch are connected to the second terminal of the bootstrap capacitor, a second terminal of the first switch is connected to a second power source, a second terminal of the second switch is connected to the third node,
   the first switch is configured to be in an on-state in response to the second detecting control signal to provide a second voltage to the second terminal of the bootstrap capacitor, and to be in an off-state in response to the first detecting control signal;
   the second switch is configured to be in an off-state in response to the second detecting control signal, and to be in an on-state in response to the first detecting control signal to provide a voltage of the driving electrical level signal to the second terminal of the bootstrap capacitor, so as to raise the first terminal of the bootstrap capacitor from the first voltage to a third voltage, the third voltage is a sum of the voltage of the driving electrical level signal and a voltage difference between the first voltage and the second voltage.

9. The electrical level processing circuit according to claim 8, wherein the bootstrap circuit further comprises a buffer,
   a first terminal of the buffer is connected to the third node, a second terminal of the buffer is connected to the first terminal of the bootstrap capacitor, a third terminal of the buffer is connected to the output terminal, and the buffer is configured to output the third voltage of the first terminal of the bootstrap capacitor to the output terminal in a case where the first node is conductive with the third node.

10. The electrical level processing circuit according to claim 9, wherein the buffer comprises a comparator or an operational amplifier.

11. The electrical level processing circuit according to claim 8, wherein the second voltage is 0 V, the third voltage is a sum of the first voltage and the voltage of the driving electrical level signal.

12. The electrical level processing circuit according to claim 11, wherein the first voltage is equal to the voltage of the driving electrical level signal.

13. The electrical level processing circuit according to claim 8, wherein the switching circuit comprises a third switch and a fourth switch,
   a first terminal of the third switch and a first terminal of the fourth switch are connected to the first node, a second terminal of the third switch is connected to the third node, a second terminal of the fourth switch is connected to the output terminal,
   the third switch is configured to be in an on-state in response to the first detecting control signal, and to be in an off-state in response to the second detecting control signal; and
   the fourth switch is configured to be in an on-state in response to the second detecting control signal, and to be in an off-state in response to the first detecting control signal.

14. The electrical level processing circuit according to claim 13, wherein the first switch, the second switch, the third switch, and the fourth switch are all switching transistors, and control terminals of the four switches are all connected to the second node.

15. The electrical level processing circuit according to claim 1, wherein the voltage of the driving electrical level signal is greater than a voltage of the received signal.

16. The electrical level processing circuit according to claim 4, wherein the bootstrap circuit comprises a bootstrap capacitor, a unidirectional circuit, a first switch, a second switch and a buffer,
   an input terminal of the unidirectional circuit is connected to a first power source, and an output terminal of the unidirectional circuit is connected to a first terminal of the bootstrap capacitor to provide a first voltage to the first terminal of the bootstrap capacitor, a second terminal of the bootstrap capacitor is configured to be electrically conductive with the third node in response to the first detecting control signal;
   a first terminal of the first switch and a first terminal of the second switch are connected to the second terminal of the bootstrap capacitor, a second terminal of the first switch is connected to a second power source, a second terminal of the second switch is connected to the third node, the first switch is configured to be in an on-state in response to the second detecting control signal to provide a second voltage to the second terminal of the bootstrap capacitor, and to be in an off-state in response to the first detecting control signal; the second switch is configured to be in an off-state in response to the second detecting control signal, and to be in an on-state in response to the first detecting control signal to provide a voltage of the driving electrical level signal to the second terminal of the bootstrap capacitor, so as to raise the first terminal of the bootstrap capacitor from the first voltage to a third voltage, the third voltage is a sum of the voltage of the driving electrical level signal and a voltage difference between the first voltage and the second voltage;
   a first terminal of the buffer is connected to the third node, a second terminal of the buffer is connected to the first terminal of the bootstrap capacitor, a third terminal of the buffer is connected to the output terminal, and the buffer is configured to output the third voltage of the first terminal of the bootstrap capacitor to the output terminal in a case where the first node is conductive with the third node.

17. The electrical level processing circuit according to claim 16, wherein the switching circuit comprises a third switch and a fourth switch, a first terminal of the third switch and a first terminal of the fourth switch are connected to the first node, a second terminal of the third switch is connected to the third node, a second terminal of the fourth switch is connected to the output terminal,
   the third switch is configured to be in an on-state in response to the first detecting control signal, and to be in an off-state in response to the second detecting control signal; the fourth switch is configured to be in an on-state in response to the second detecting control signal, and to be in an off-state in response to the first detecting control signal.

18. A gate driving circuit, comprising a shift register circuit and an electrical level processing circuit, the shift register circuit being electrically connected to the electrical level processing circuit to receive a clock signal processed by the electrical level processing circuit, wherein the electrical level processing circuit comprises:
an electrical level conversion circuit, connected to a first node, and configured to convert a received signal into a driving electrical level signal and provide the driving electrical level signal to the first node;
a control circuit, comprising a detecting circuit, the control circuit being connected to a second node, and configured to output a detecting control signal to the second node according to a signal detected by the detecting circuit, wherein the detecting control signal comprises a first detecting control signal and a second detecting control signal;
a switching circuit, connected to the first node, the second node, a third node and an output terminal, and configured to electrically conduct the first node and the third node in response to the first detecting control signal; and
a bootstrap circuit, connected to the second node, the third node and the output terminal, and configured to amplify the driving electrical level signal and output the driving electrical level signal that has been amplified to the output terminal in response to the first detecting control signal.

19. A display device, comprising a gate driving circuit, the gate driving circuit comprising a shift register circuit and an electrical level processing circuit, the shift register circuit being electrically connected to the electrical level processing circuit to receive a clock signal processed by the electrical level processing circuit, wherein the electrical level processing circuit comprises:
an electrical level conversion circuit, connected to a first node, and configured to convert a received signal into a driving electrical level signal and provide the driving electrical level signal to the first node;
a control circuit, comprising a detecting circuit, the control circuit being connected to a second node, and configured to output a detecting control signal to the second node according to a signal detected by the detecting circuit, wherein the detecting control signal comprises a first detecting control signal and a second detecting control signal;
a switching circuit, connected to the first node, the second node, a third node and an output terminal, and configured to electrically conduct the first node and the third node in response to the first detecting control signal; and
a bootstrap circuit, connected to the second node, the third node and the output terminal, and configured to amplify the driving electrical level signal and output the driving electrical level signal that has been amplified to the output terminal in response to the first detecting control signal.

* * * * *